(12) United States Patent
Kajii et al.

(10) Patent No.: US 6,603,158 B1
(45) Date of Patent: Aug. 5, 2003

(54) SEMICONDUCTOR INTEGRATED CIRCUIT HAVING HIGH-DENSITY BASE CELL ARRAY

(75) Inventors: Yoshio Kajii, Kawasaki (JP); Toru Osajima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/624,391

(22) Filed: Jul. 27, 2000

(30) Foreign Application Priority Data

Jul. 30, 1999 (JP) .......................................... 11-217135

(51) Int. Cl.$^7$ .............................................. H01L 27/10
(52) U.S. Cl. ...................... 257/206; 257/202; 257/204; 257/205; 257/207; 257/208; 257/210; 257/211
(58) Field of Search ................................. 257/202, 206, 257/204, 205, 207, 208, 210, 211

(56) References Cited

U.S. PATENT DOCUMENTS

| 4,570,176 A | * | 2/1986 | Kolwicz |
| 4,851,892 A | * | 7/1989 | Anderson et al. |
| 4,884,115 A | * | 11/1989 | Michel et al. |
| 5,079,614 A | * | 1/1992 | Khatakhotan |
| 5,341,041 A | * | 8/1994 | El Gamal |
| 5,420,447 A | * | 5/1995 | Waggoner |
| 5,581,202 A | * | 12/1996 | Yano et al. |
| 5,616,940 A | * | 4/1997 | Kato et al. |
| 5,652,441 A | * | 7/1997 | Hashimoto et al. |
| 5,723,883 A | | 3/1998 | Gheewalla |
| 5,814,844 A | * | 9/1998 | Nagata et al. |
| 5,898,194 A | * | 4/1999 | Gheewala |
| 5,917,207 A | * | 6/1999 | Colwell et al. |
| 5,920,089 A | * | 7/1999 | Kanazawa et al. |
| 5,932,900 A | * | 8/1999 | Lin et al. |
| 6,043,521 A | * | 3/2000 | Shibutani et al. |
| 6,177,691 B1 | * | 1/2001 | Iranmanesh et al. |
| 6,271,548 B1 | * | 8/2001 | Umemoto et al. |

FOREIGN PATENT DOCUMENTS

| JP | 62150740 | * | 7/1987 |
| JP | 05136356 | * | 6/1993 |
| JP | 05190817 | * | 7/1993 |
| JP | 06196666 | * | 7/1994 |
| JP | 06196668 | * | 7/1994 |

* cited by examiner

Primary Examiner—Eddie Lee
Assistant Examiner—Eugene Lee
(74) Attorney, Agent, or Firm—Armstrong, Westerman & Hattori, LLP

(57) ABSTRACT

A base cell is configured such that P-type regions 11 to 13 are arrayed in a column direction in an N-type well 10, N-type regions 21 to 23 are arrayed in a column direction in a P-type well 20 next to the N-type well, gate lines 34A and 35B passing above a channel between the P-type regions and further between the N-type regions are formed in a row direction, and well contact regions 16C and 26C are formed in the wells 10 and 20 at outer ends thereof, respectively, while no gate contacts are formed at the outer ends. Power supply lines VDD and VSS connected to the well contact regions are formed in the column direction in a second wiring layer above a first wiring layer.

7 Claims, 15 Drawing Sheets

SEMICONDUCTOR INTEGRATED CIRCUIT HAVING HIGH-DENSITY BASE CELL ARRAY

BACKGROUND OF THE INVENTION

1. Field of the Invention

The present invention relates to a semiconductor integrated circuit, in which base cells are arrayed in first and second directions perpendicular to each other, fabricated according to a master slice method or a standard cell method.

2. Description of the Related Art

FIG. 14(A) is a top view of a prior art base cell BCX in which gate lines are hatched (this applies to other figures).

The base cell BCX comprises an N-type well 10 indicated with a double dot and dash line, P-type diffused regions 11, 12 and 13 arrayed in a column direction and formed in the N-type well 10, and gate lines 14 and 15 formed above a channel between the P-type diffused regions 11 and 12 and above a channel between the P-type diffused regions 12 and 13, respectively, with a gate insulating film, for example a gate oxide film, interposed between each channel and gate line. Further, the base cell BCX comprises $N^+$-type well contact regions 16 and 17 formed in the N-type well 10 in such a manner that they sandwich the P-type diffused regions 11 to 13 as a whole. Likewise, the base cell BCX comprises a P-type well 20 indicated with a double dot and dash line next to the N-type well 10, N type diffused regions 21, 22 and 23 arrayed in a column direction and formed in the P-type well 20, and gate lines 24 and 25 formed above a channel between the N-type diffused regions 21 and 22, and above a channel between the N-type diffused regions 22 and 23, respectively, with a gate insulating film interposed between each channel and gate line. $P^+$-type well contact regions 26 and 27 are formed in the P-type well 20 in such a manner that they sandwich the N-type diffused regions 21 to 23 as a whole. At both ends of each of the gate lines 14, 15, 24 and 25, there are gate contact regions for connecting through interlayer contacts and conductive lines.

For example, one NAND gate with two-input is constituted of one base cell BCX with connecting conductive lines in the cell in a first wiring layer and power supply lines in a second wiring layer. The $N^+$-type well contact regions 16 and 27 are connected to a power supply line VDD and a ground line VSS, respectively, in the second wiring layer above the first wiring layer. In FIG. 14(A), the VDD and VSS lines are represented by center lines thereof (a single dot and dash line) for simplicity.

Such base cells are arrayed in rows and columns on a semiconductor substrate to form, for example, a gate array according to a master slice method. In a row direction, base cells are arranged with no superimposition between adjacent cells. However, in a column direction, as shown in FIG. 14(B), base cells are arranged with superimposing well contact regions adjacent to each other in a design.

Cell pitches of the gate array in row and column directions are 10G and 4G, respectively, wherein G, for example, 0.8 mm denotes a pitch of a grid in design. Interconnections between cells are implemented in a third wiring layer above the second wiring layer. Automatic interconnection design using a computer is performed along grid lines.

Since the base cell BCX has the construction in which the $N^+$-type well contact regions 16 and 17 are formed in the N-type well 10 in such a manner that they sandwich the P-type diffused regions 11 to 13, while the $P^+$-type well contact regions 26 and 27 are formed in the P-type well 20 in such a manner that they sandwich the N-type diffused regions 21 to 23, a cell size is larger, thereby reducing a degree of integration.

Further, the well contact regions 17 and 26 are useless.

Connections between cells are mainly implemented by conductive lines in a column direction. However, connections in a column direction cannot be implemented in the second wiring layer since the power supply lines VDD and VSS are formed in a row direction in the second wiring layer.

FIG. 15(A) is a top view of another prior art base cell BCY.

In the base cell BCY, a gate line 34 serially passes above a channel between P-type diffused regions 11 and 12A and above a channel between N-type diffused regions 21 and 22A and similar to this, a gate line 35 serially passes above a channel between P-type diffused regions 12A and 13 and above a channel between N-type diffused regions 22A and 23. With these series of the gate lines, a cell pitch of a gate array in a row direction is (8G+G') as shown in FIG. 15(B), and the cell pitch is shorter than that of 10G of FIG. 14(B) by (2G–G'). For example, when G=0.8 mm and G'=1.0 mm, 2G–G'=0.6 mm. The reason why the cell pitch of the gate array in the row direction is not 9G but (8G+G') is that when cells are arrayed in the row direction, there arise a need to ensure a margin between adjacent gate contact regions, which is required from design rules.

Further, instead of the $N^+$-type well contact regions 16 and 17 of FIG. 14(A), an $N^+$-type well contact region 16A is formed in the N-type well 10 under a place between gate contact regions 341 and 351 formed at one ends of the gate lines 34 and 35, and similar to this, instead of the $P^+$-type well contact regions 26 and 27 of FIG. 14(A), a $P^+$-type well contact region 26A is formed in the P-type well 20 under a place between gate contact regions 342 and 352 formed at the other ends of the gate lines 34 and 35. Since there arise a need to ensure margins between the $N^+$-type well contact region 16A and each of the gate contact regions 341 and 351, which is required from design rules, widths of the diffused regions 12A and 22A in a column direction are necessary to be wider than those of other diffused regions. Hence, a cell pitch of a gate array in a column direction is (2G+G') as shown in FIG. 15(B). For this reason, a higher degree of integration was restricted.

SUMMARY OF THE INVENTION

Accordingly, it is an object of the present invention to provide a semiconductor integrated circuit having a high-density base cell array.

In one aspect of the present invention, there is provided a semiconductor integrated circuit comprising base cells arrayed in first and second directions perpendicular to each other, each base cell comprising: an N-type well; a plurality of P-type regions formed in the N-type well and arrayed in the second direction; a P-type well arranged adjacent to the N-type well in the first direction; a plurality of N-type regions formed in the P-type well and arrayed in the second direction; gate lines each formed in the first direction with passing above a channel between adjacent two of the P-type regions and passing above a channel between adjacent two of the N-type regions, each of the gate lines not having gate contact regions at both ends thereof; an N-type well contact region formed in the N-type well on a side of a first directional end of one of the gate lines; a P-type well contact region formed in the P-type well on a side of an opposite first directional end of one of the gate lines; an intra-cell interconnections formed in a first wiring layer; a first power supply line connected to the N-type well contact region with passing in the second direction, the first power supply line formed in a second wiring layer above the first wiring layer; and a second power supply line connected to the P-type well contact region with passing in the second direction, the second power supply line formed in the second wiring layer.

With this aspect, since the widths of the P-type regions and N-type regions in the second direction can be same as each other, a cell pitch can be more shortened than the prior art, thereby enabling higher density of base cell array.

Further, since the power supply lines are formed in the second direction, interconnections between base cells in the second direction can be performed using the second wiring layer and automatic interconnection ratio can be increased. Thereby, a higher integration can be achieved.

Other aspects, objects, and the advantages of the present invention will become apparent from the following detailed description taken in connection with the accompanying drawings.

DESCRIPTION OF THE PREFERRED EMBODIMENTS

Figure 1A:
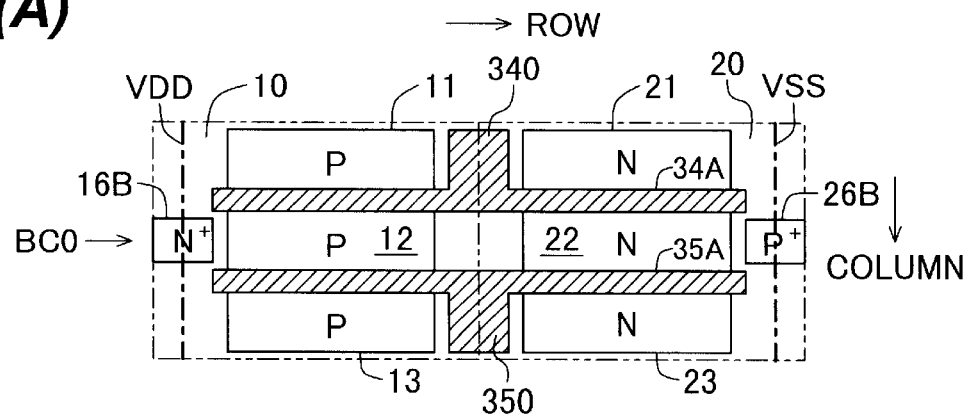
FIG. 1(A) is a top view of a base cell of a first embodiment according to the present invention.

Referring now to the drawings, wherein like reference characters designate like or corresponding parts throughout several views, preferred embodiments of the present invention are described below.

First Embodiment

FIG. 1(A) is a top view of a base cell BCO of a first embodiment according to the present invention.

In the base cell BCO, P-type diffused regions 11 to 13 are arrayed in a column direction in an N-type well 10 indicated with a double dot and dash line, and N-type diffused regions 21 to 23 are arrayed in a column direction in a P-type well 20 indicated with a double dot and dash line, next to the N-type well 10. A gate line 34A passes above a channel between the P-type diffused regions 11 and 12 and above a channel between the N-type diffused regions 21 and 22, while a gate line 35A passes above a channel between the P-type diffused regions 12 and 13 and above a channel between the N-type diffused regions 22 and 23.

In the middle portions of the gate lines 34A and 35A, gate contact regions 340 and 350, respectively, are formed. The gate contact region 340 is located above a place between the P-type diffused region 11 and the N-type diffused region 21, while the gate contact region 350 is located above a place between the P-type diffused region 13 and the N-type diffused region 23. An $N^+$-type well contact region 16B is formed in the N-type well 10 on the side of one ends of the gate lines 34A and 35A, while a $P^+$-type well contact region 26B is formed in the P-type well 20 on the side of the other ends of the gate lines 34A and 35A. No gate contact regions are formed at both ends of each of the gate lines 34A and 35B. With this construction, widths of the diffused regions 12 and 22 in a column direction can be narrower than those of the diffused regions 12A and 22A of FIG. 15(A). That is, the widths of the diffused regions 12 and 22 in the column direction are same as those of the other diffused regions.

Figure 1B:
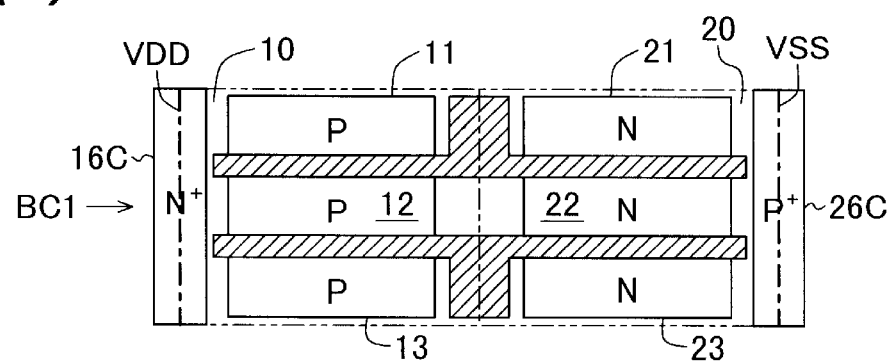
FIG. 1(B) is a top view of a modification made to the base cell of FIG. 1(A)
Figure 1C:
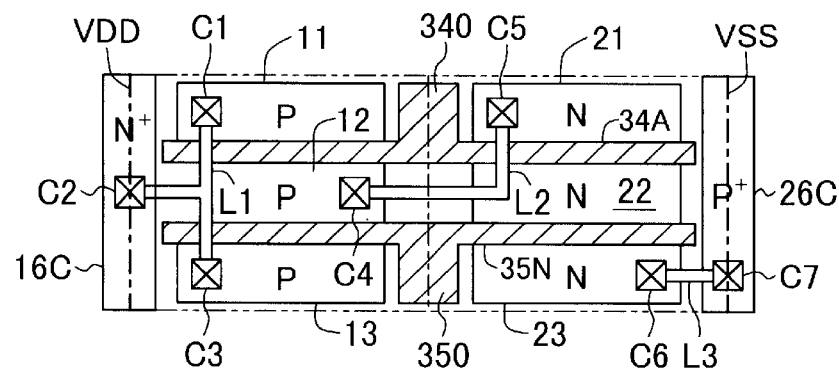
FIG. 1(C) is a top view of a two-input NAND gate formed using the base cell of FIG. 1(B)

A power supply line VDD and a ground line VSS are formed, in a second wiring layer above a first wiring layer, above the $N^+$-type well contact region 16B and the $P^+$-type well contact region 26B and in a column direction. In FIGS. 1(A) to 1(C), the power supply lines VDD and VSS are represented by their center lines drawn with a single dot and dash line for simplicity, and this applies to other figures.

Insulating films, for example, an oxide film, are provided between a semiconductor substrate and the first wiring layer and between the wiring layers. A base cell BC1 shown in FIG. 1(B) is a modification made to that of FIG. 1 (A), and an $N^+$-type well contact region 16C and a $P^+$-type well contact region 26C are formed in the N-type well 10 and the P-type well 20, respectively, in a column direction and lengths thereof are equal to a length in the column direction of a cell frame. The other points are same as those in the base cell BC0 of FIG. 1(A).

FIG. 1(C) shows a two-input NAND gate having the basic BC1 of FIG. 1(B), interconnections L, L2 and L3 formed in the first wiring layer, and interlayer contacts C1 to C7 indicated by marks x. The interlayer contact C1 is for connecting the P-type diffused region 11 and the conductive line L1, the interlayer contact C2 is for connecting the $N^+$-type well contact region 16C and for connecting the conductive line L1 and the power supply line VDD thereabove, and the interlayer contact C3 is for connecting the P-type diffused region 13 and the conductive line L1. The interlayer contact C4 is for connecting the P-type diffused region 12 and the conductive line L2, and the interlayer contact C5 is for connecting the N-type diffusion region 21 and the conductive line L2. The interlayer contact C6 is for connecting the N-type diffused region 23 and the conductive line L3, and the interlayer contact C7 is for connecting the $P^+$-type well contact region 26C and the conductive line L3 and for connecting the conductive line L3 and the ground line VSS thereabove.

Since the power supply line VDD is arranged close to the P-type diffused regions 11 to 13 and the ground line VSS is arranged close to the N-type diffused regions 21 to 23, the interconnections L1 and L3 therebetween are shortened, which increases a degree of freedom of the intra-cell conductive line L2 which is other than the interconnections L1 and L3.

Figure 2:
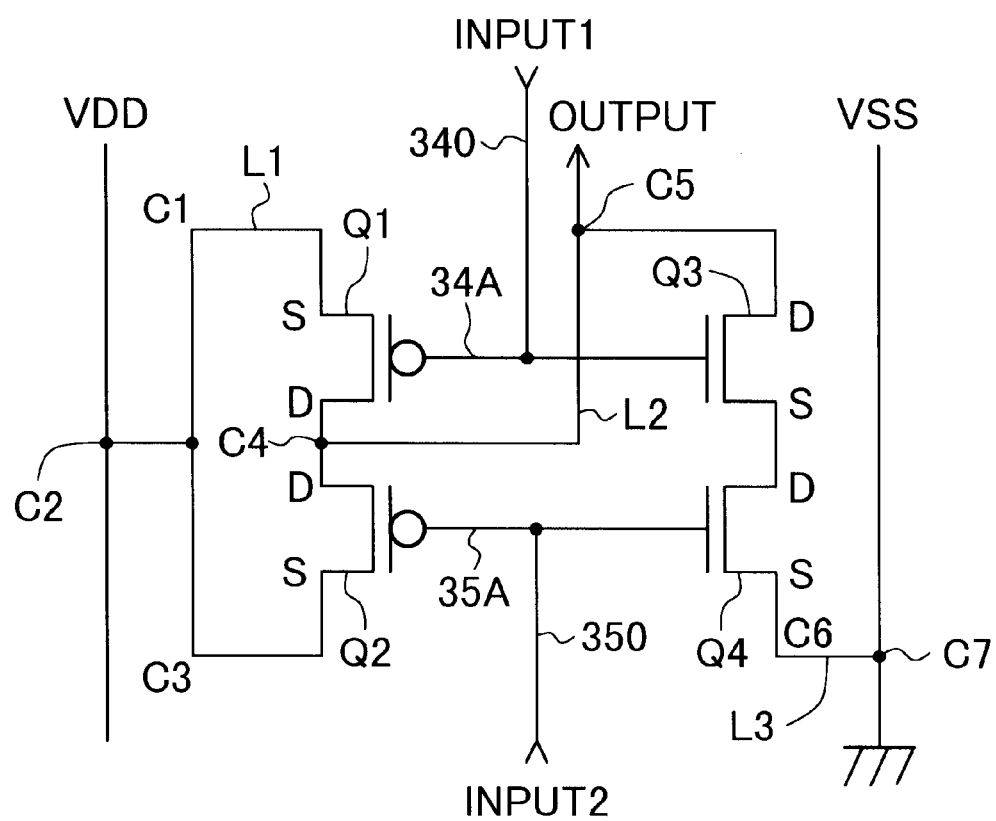
FIG. 2 is a circuit diagram of the two-input NAND gate drawn in a corresponding manner to the pattern of FIG. 1(C)

FIG. 2 is a circuit diagram of the two-input NAND gate drawn in a corresponding manner to the pattern of FIG. 1(C).

A PMOS transistor Q1 comprises the P-type diffused regions 11 and 12, and the gate line 34A above a channel between the P-type diffused regions 11 and 12, a PMOS transistor Q2 comprises the P-type diffused regions 12 and 13, and the gate line 35A above a channel between the P-type diffused regions 12 and 13, an NMOS transistor Q3 comprises the N-type diffused regions 21 and 22, and the gate line 34A above a channel between the N-type diffused regions 21 and 22, and an NMOS transistor Q4 comprises the N-type diffused regions 22 and 23, and the gate line 35A above a channel between the N-type diffused regions 22 and 23. Reference characters S and D in FIG. 2 denote source and drain, respectively, of each transistor. Input signals 1 and 2 are provided to the gate contact regions 340 and 350, respectively, and an output signal is taken out from the contact C5.

Figure 3:
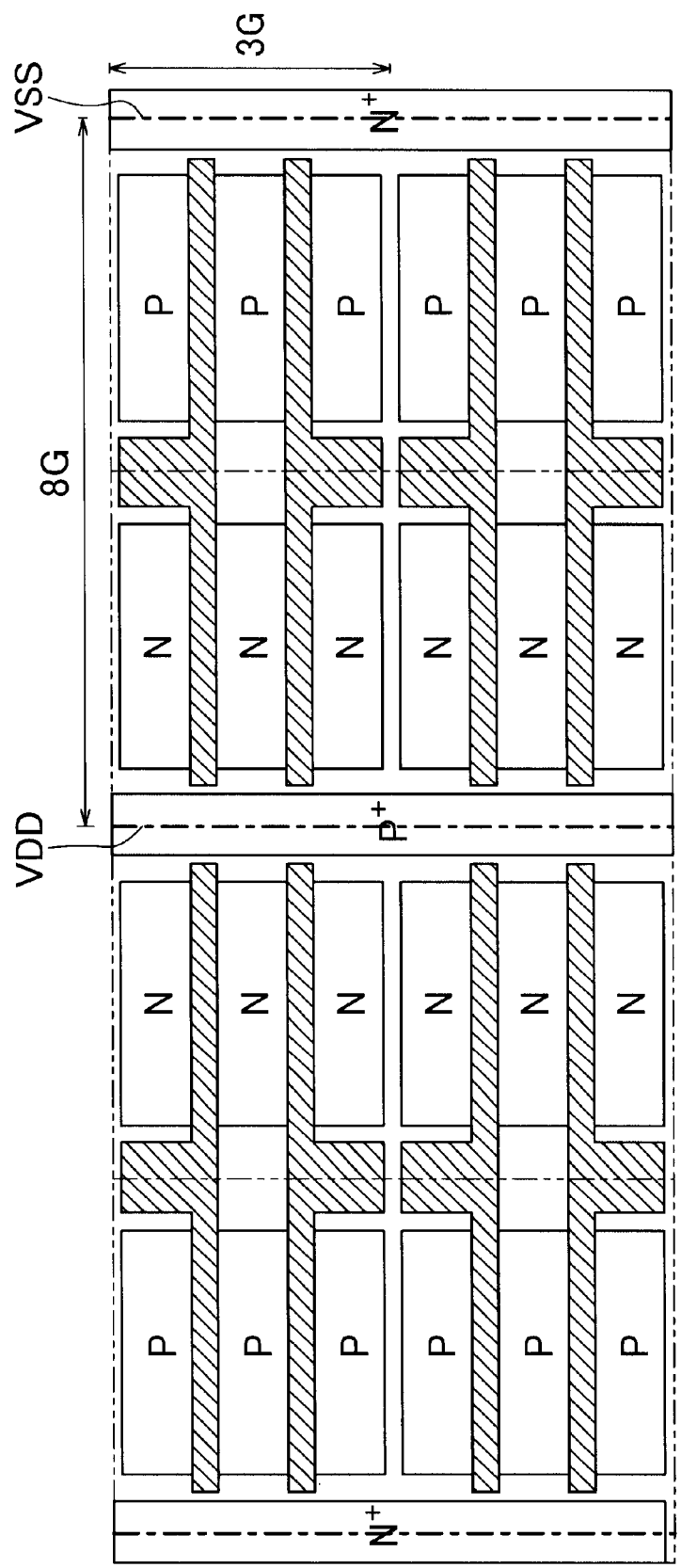
FIG. 3 is a top view of an array of 2×2 base cells, each is same as the cell of FIG. 1(B), with adjacent well contact regions superimposed one on the other.

FIG. 3 is a top view of an array constructed from base cells, each is same as the cell BC1 of FIG. 1(B), in a matrix of two rows and two columns with adjacent $P^+$-type well contact regions 26C superimposed one on the other in design. In a semiconductor integrated circuit having a larger array according to the master slice method, $N^+$-type well contact regions are also superimposed one on the other in design.

Figure 15A:
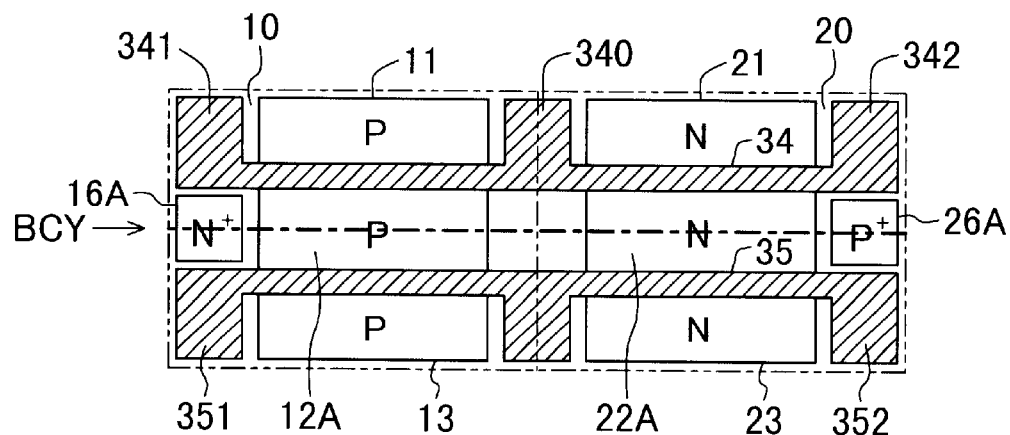
FIG. 15(A) is a top view of a prior art other base cell.
Figure 15B:
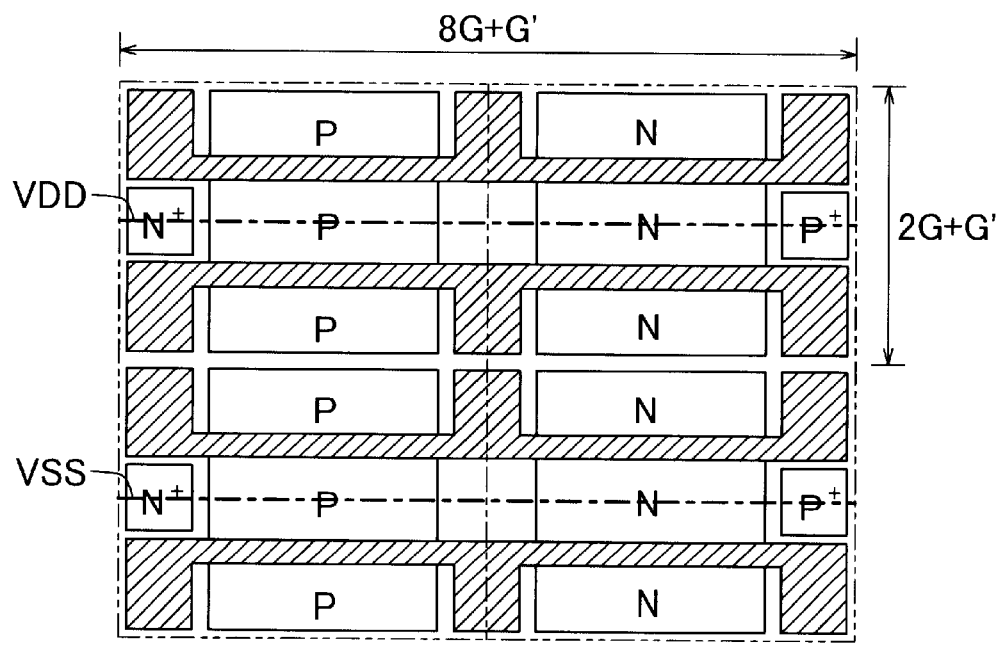
FIG. 15(B) is a top view of an array of 2×1 base cells, each is same as the cell of FIG. 15(A).

With such superimposition, since cell pitches in row and column directions are 8G and 3G, respectively, and shorter than (8G+G') and (2G+G') of FIG. 15(B), respectively, higher integration can be achieved. In a case of G'=1.2G for example, a cell area ratio of the embodiment to the prior art is (8/9.2)×(3/3.2)=0.82 and an on-chip area of a gate array is reduced by about 18% compared with the prior art.

Further, since the power supply lines are formed along the column direction, intra-cell interconnections in the column direction can be implemented using the second wiring layer, which improves a ratio of automatic interconnection. Thereby, a higher integration can be achieved.

Second Embodiment

Figure 4A:
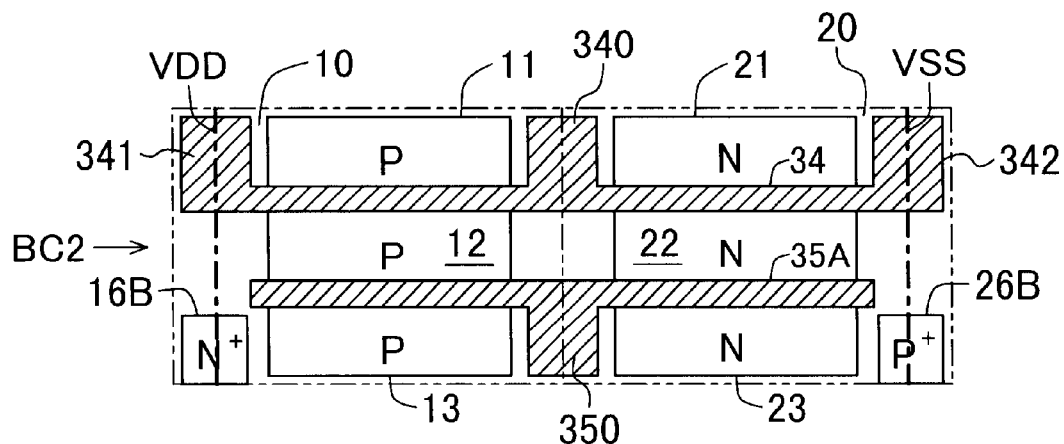
FIG. 4(A) is a top view of a base cell of a second embodiment according to the present invention.

FIG. 4(A) is a top view of a base cell BC2 of a second embodiment according to the present invention.

The base cell BC2 is obtained by deleting the gate contact regions 351 and 352 of the gate line 35 in the base cell BCY of FIG. 15(A) to form a gate line 35A, and by forming an $N^+$-type well contact region 16B and a $P^+$-type well contact region 26B under the deleted regions in the N-type well 10 and the P-type well 20, respectively. With this construction, since the width of the diffused region 12 in a column direction can be same as those of the diffused regions 11 and 13, and likewise this also applies to the diffused region 22, an on-chip area of the base cell is reduced compared with the base cell BCY, thereby improving a degree of integration. In a case of G'=1.2G for example, a cell ratio of the embodiment to the prior art is 3/3.2=0.94, which decreases an on-chip area of the array by about 6% compared with the prior art.

Further, since the power supply line VDD and the ground line VSS formed in the second wiring layer above the $N^+$-type well contact region 16B and the $P^+$-type well contact region 26B, respectively, are arranged along a column direction, there can be enjoyed the improvement, as described in the first embodiment, on degree of freedom of intra-cell interconnections and on a ratio of automatic connection in inter-cell interconnections.

Figure 4B:
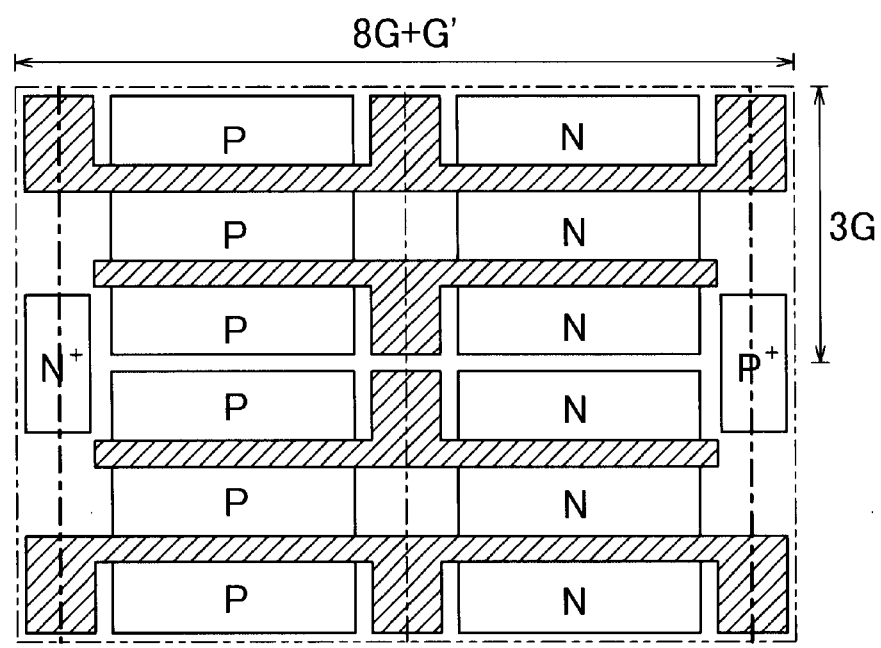
FIG. 4(B) is a top view of an array of 2×1 base cells consists of the cell of FIG. 4(A) and a cell obtained by vertically flipping the cell of FIG. 4(A)

FIG. 4(B) is a top view of an array of two rows and one column having the base cell BC2 of FIG. 4(A) and a cell obtained by vertically flipping the cell of FIG. 4(A). With this flipping, since well contacts adjacent to each other are arrayed in a serial manner, the number of interlayer contacts between the power supply lines and well contact regions decreases, thereby enabling other interlayer contacts to be formed in free spaces saved this way.

Figure 5:
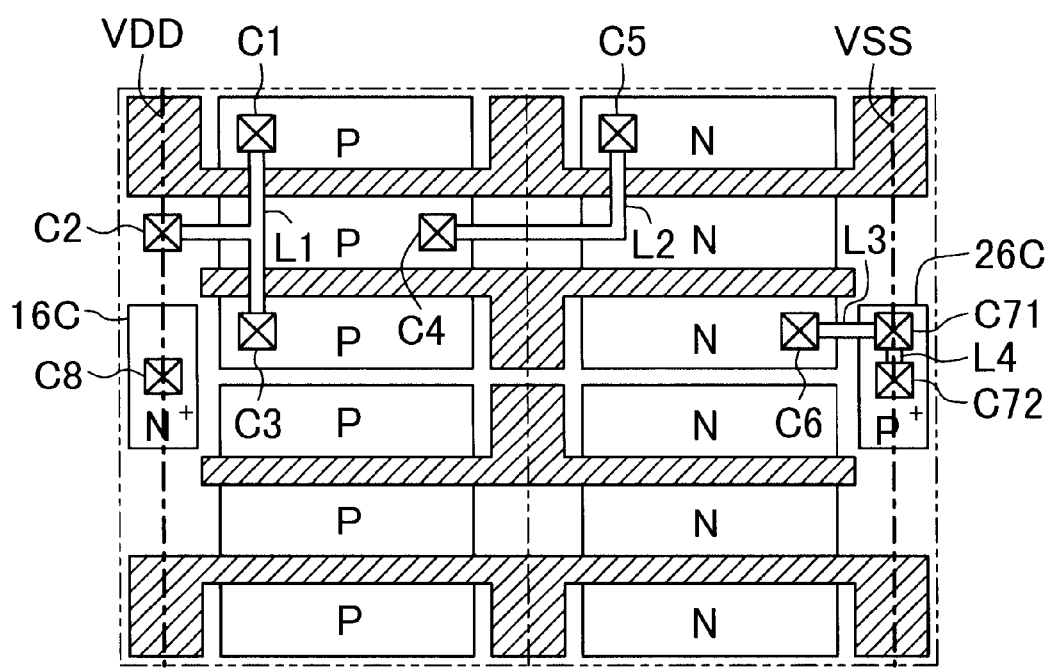
FIG. 5 is a top view of a two-input NAND gate having the base cell array of FIG. 4(B), interconnections in a first wiring layer, and contacts for contacting the interconnections with portions in the base cell array.

FIG. 5 is a top view of a two-input NAND gate having the base cells of FIG. 4(B), interconnections L1 to L4 formed in the first wiring layer and interlayer contacts C1 to C6, C71, C72 and C8, as in FIG. 1(C).

The interlayer contact C71 is for connecting conductive lines L3 and L4 to the $P^+$-type well contact region 26C thereunder, and the interlayer contact C72 is for connecting the conductive line L4 to the ground line VSS thereabove. The interlayer contact C8 is for connecting the power supply line VDD to the $N^+$-type well contact region 16C.

Figure 6:
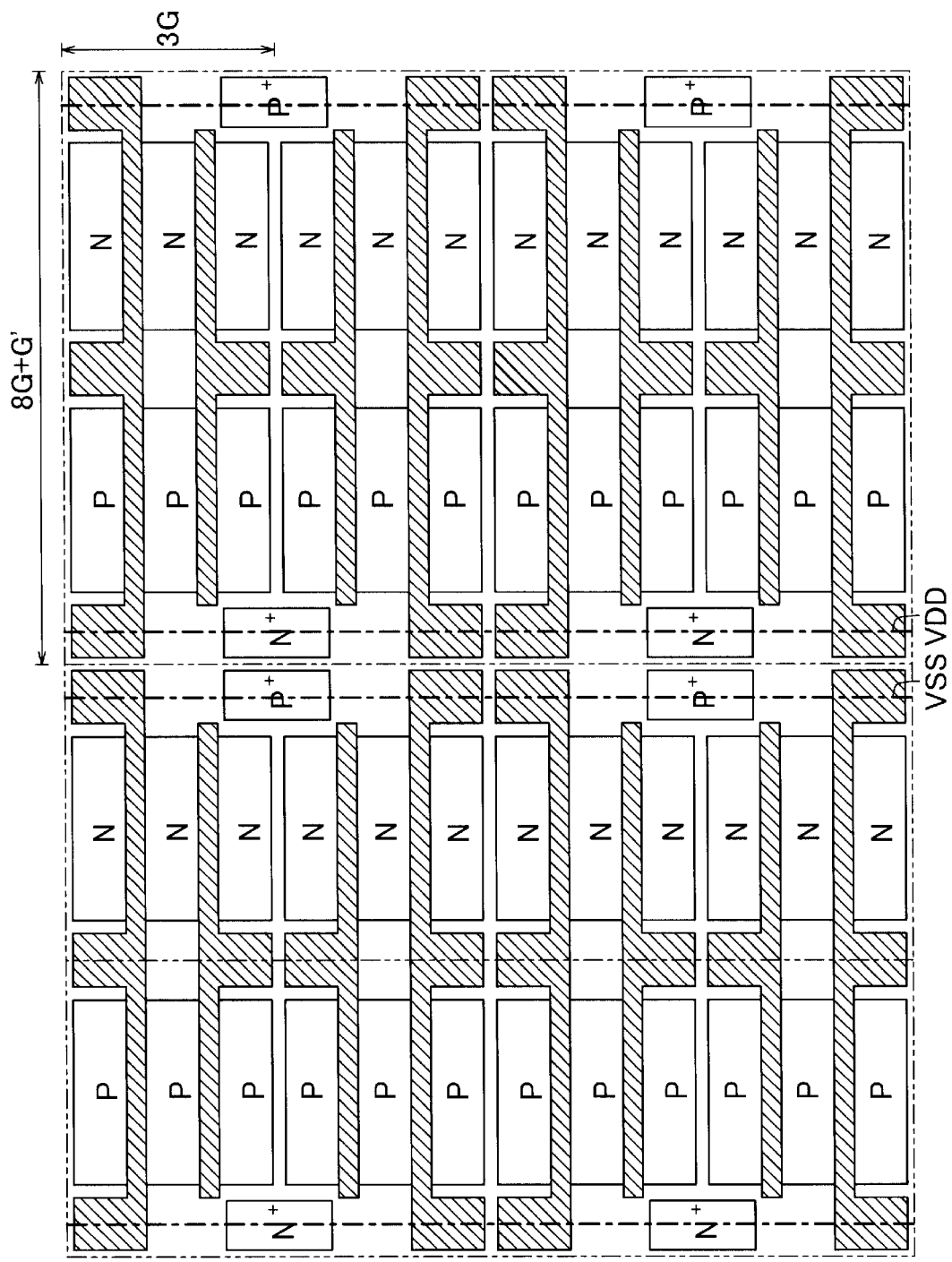
FIG. 6 is a top view of an array having 2×2 sub-arrays, each is same as the array of FIG. 4(B)

FIG. 6 is a top view of an array having 2×2 sub-arrays, each is same as the array of FIG. 4(B).

Figure 7:
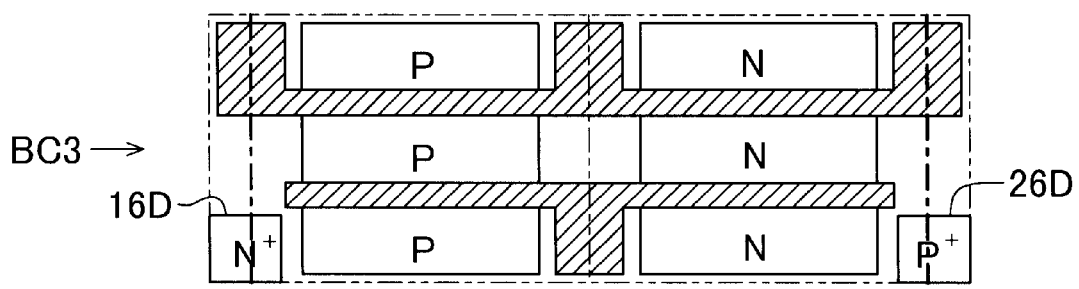
FIG. 7 is a top view of a modification made to the base cell of FIG. 4(A)

FIG. 7 is a top view of a base cell BC3 which is a modification made to the base cell BC2 of FIG. 4(A).

The base cell BC3 has an $N^+$-type well contact region 16D and a $P^+$-type well contact region 26D both extending outward in the row direction up to a cell frame. The other points are same as those of the base cell BC2.

Figure 8:
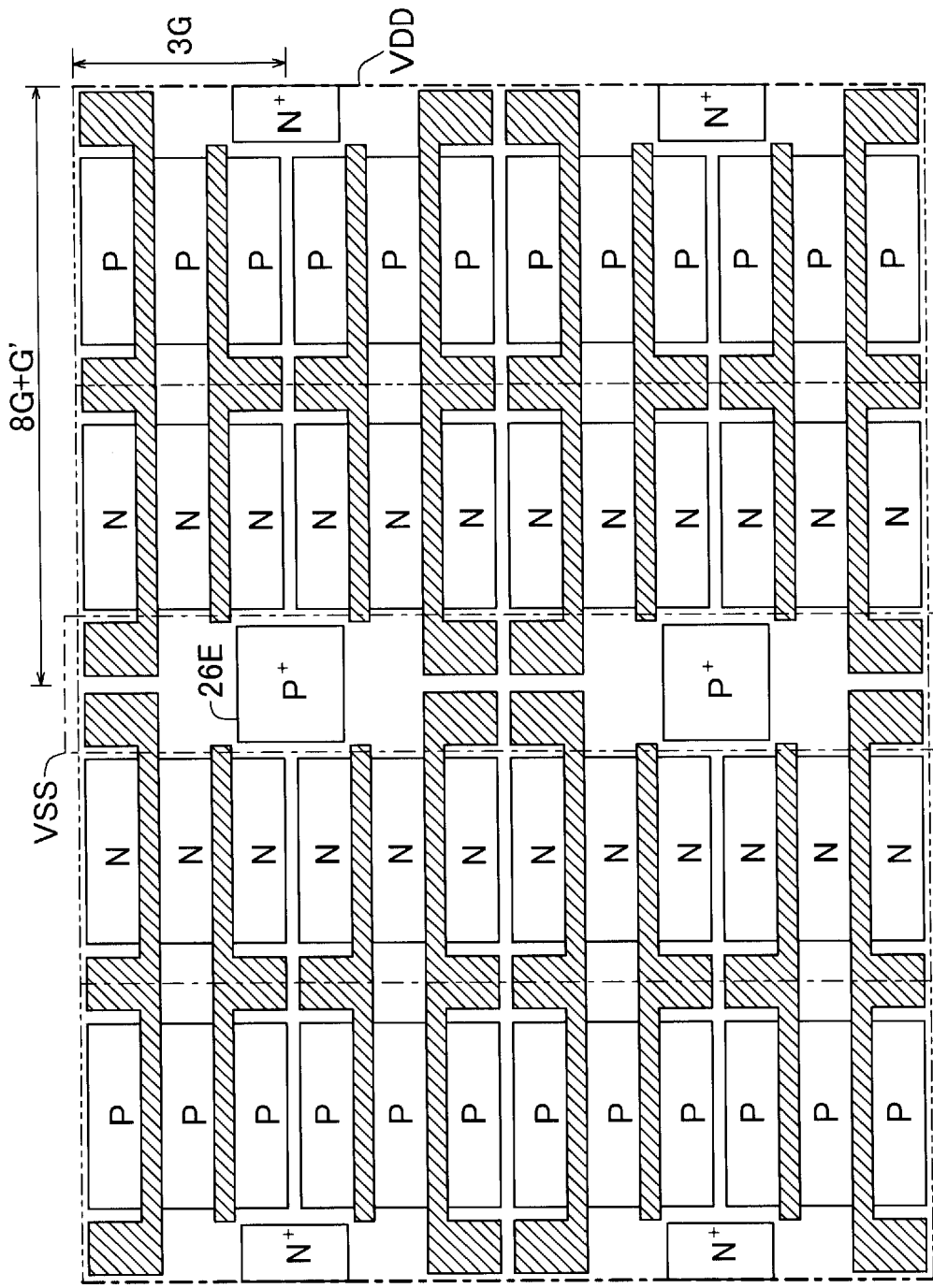
FIG. 8 is a top view of an array configured such that first sets, each having the base cell of FIG. 7 and a cell obtained by vertically flipping the base cell of FIG. 7, are arrayed in a column direction and second sets obtained by horizontally flipping the first sets are arranged horizontally adjacent to the first sets.

FIG. 8 is a top view of an array configured such that first sets, each having the base cell of FIG. 7 and a cell obtained by vertically flipping the base cell of FIG. 7, are arrayed in a column direction and second sets obtained by horizontally flipping the first sets are arranged horizontally adjacent to the first sets.

This array has a pattern 26E which is four times larger than the $P^+$-type well contact region 26D of FIG. 7. Further, since a pattern of the ground line VSS has a twice larger width than that of FIG. 6, an allowable current of the ground line VSS increases, enabling more of stabilization of the power supply potential VSS. This is also applied to the power supply line VDD when a semiconductor integrated circuit has a larger array than that of FIG. 8.

Third Embodiment

Figure 9A:
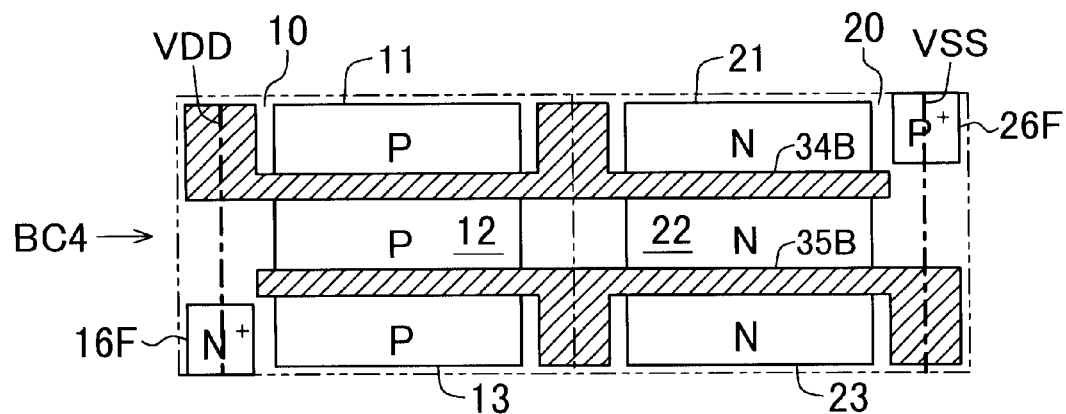
FIG. 9(A) is a top view of a base cell of a third embodiment according to the present invention.

FIG. 9(A) is a top view of a base cell BC4 of a third embodiment according to the present invention.

The base cell BC4 is obtained, in the base cell of BCY FIG. 15(A), by deleting the gate contact region 351 of the gate line 35 and the gate contact region 342 of the gate line 34 to form gate lines 35B and 34B, respectively, and by forming an N$^+$-type well contact region 16F and a P$^+$-type well contact region 26F in the N-type well 10 and the P-type well 20, respectively, thereunder. With such construction, since the width of a diffused region 12 in the column direction can be same as those of the diffused regions 11, and this is applied to the diffused region 22, an on-chip area of the base cell BC4 is reduced compared with the base cell BCY, leading to increase in degree of integration.

Further, since the power supply line VDD and the ground line VSS formed in the second wiring layer above the N$^+$-type well contact region 16F and the P$^+$-type well contact region 26F, respectively, are arranged along the column direction, there can be enjoyed the improvement, as described in the first embodiment, on degree of freedom of intra-cell interconnections and on a ratio of automatic connection in inter-cell interconnections.

Figure 9B:
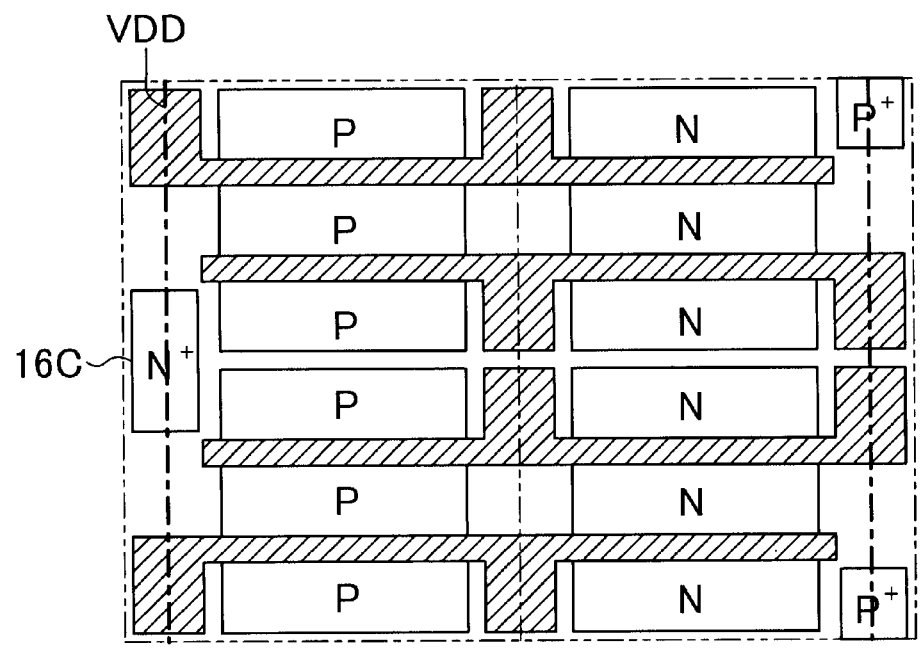
FIG. 9(B) is a top view of an array of 2×1 base cells consists of the cell of FIG. 9(A) and a cell obtained by vertically flipping the cell of FIG. 9(A)

FIG. 9(B) is a top view of an array of two rows and one column having the base cell BC4 of FIG. 9(A) and a cell obtained by vertically flipping the cell of FIG. 9(A). With this flipping, since well contacts adjacent to each other are arranged in a serial manner, the number of interlayer contacts between the power supply line VDD and N$^+$-type well contact region 16C decreases, thereby enabling other interlayer contacts to be formed in free spaces saved this way.

Figure 10:
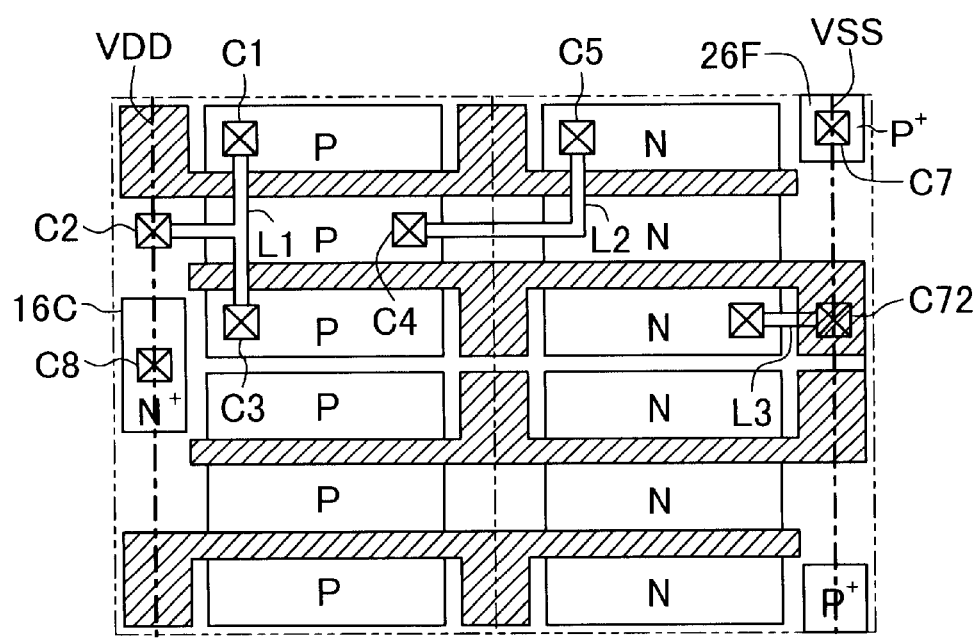
FIG. 10 is a top view of a two-input NAND gate having the base cell array of FIG. 9(B), interconnections in a first wiring layer, and contacts for contacting the interconnections with portions in the base cell array.

FIG. 10 is a top view of a two-input NAND gate having the base cells of FIG. 9(B), interconnections L1 to L4 formed in the first wiring layer and interlayer contacts C1 to C6, C72, C7 and C8, as in FIG. 1(C).

The interlayer contact C72 is for connecting the conductive line L3 and the ground line VSS thereabove, and the interlayer contact C7 is for connecting the ground line VSS and the P$^+$-type well contact region 26F. The interlayer contact C8 is for connecting the power supply line VDD and the N$^+$-type well contact region 16C thereunder.

Figure 11:
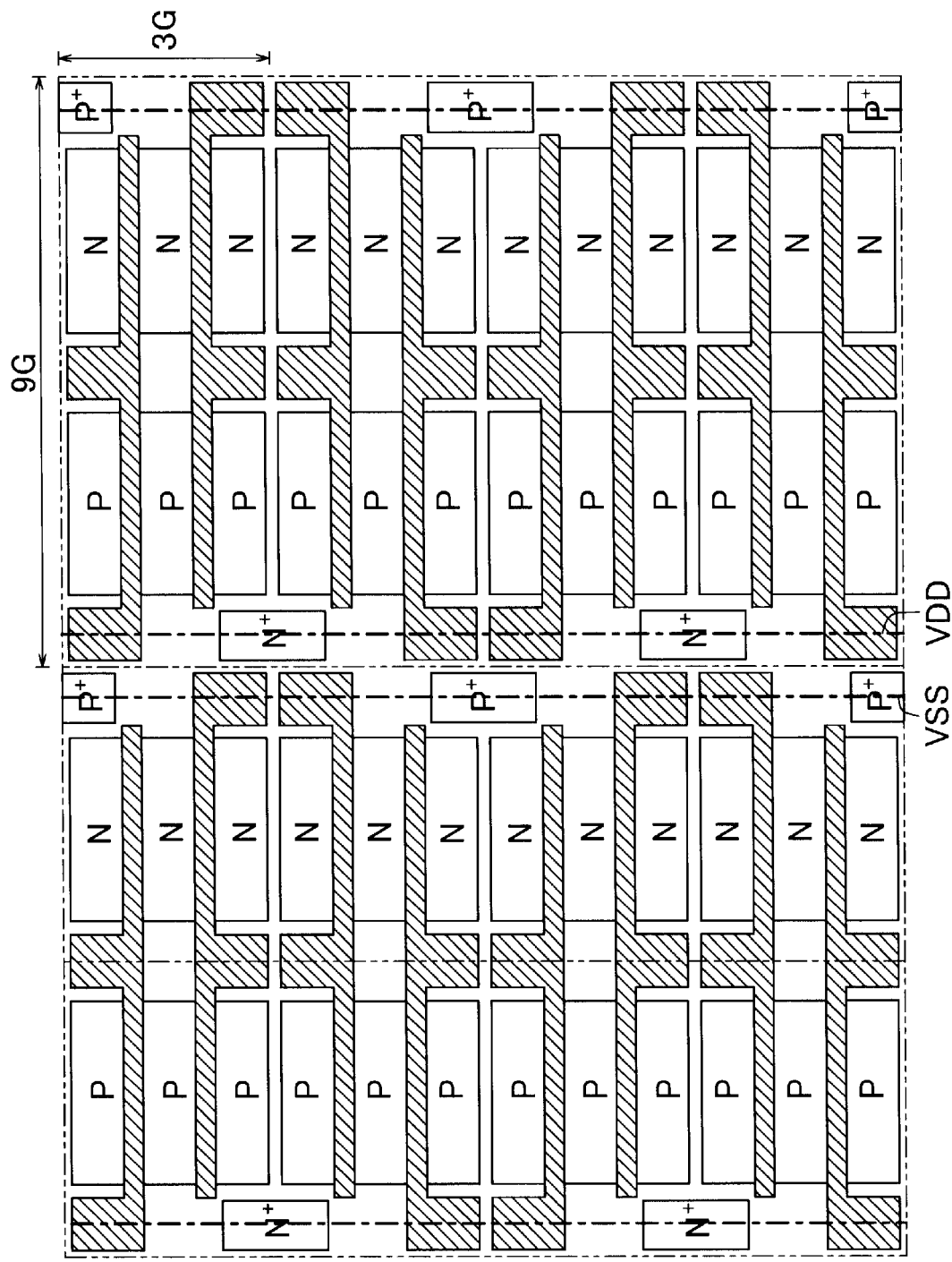
FIG. 11 is a top view of an array having 2×2 sub-arrays, each is same as the array of FIG. 9(B)

FIG. 11 is a top view of an array having 2×2 sub-arrays, each is same as the array of FIG. 9(B).

Figure 12:
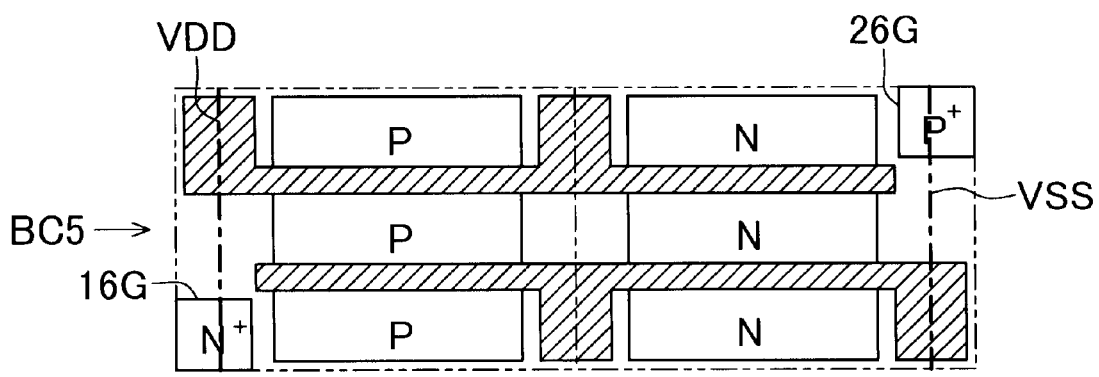
FIG. 12 is a top view of a modification made to the base cell of FIG. 9(A)

FIG. 12 is a top view of a base cell BC5 which is a modification made to the base cell BC4 of FIG. 9(A).

The base cell BC5 has an N$^+$-type well contact region 16G and a P$^+$-type well contact region 26G both extending outward in the row direction up to a cell frame. The other points are same as those of the base cell BC4.

Figure 13:
FIG. 13 is a top view of an array configured such that first sets, each having the base cell of FIG. 12 and a cell obtained by vertically flipping the base cell of FIG. 12, are arrayed in a column direction and second sets obtained by horizontally flipping the first sets are arranged horizontally adjacent to the first sets.
Figure 14A:
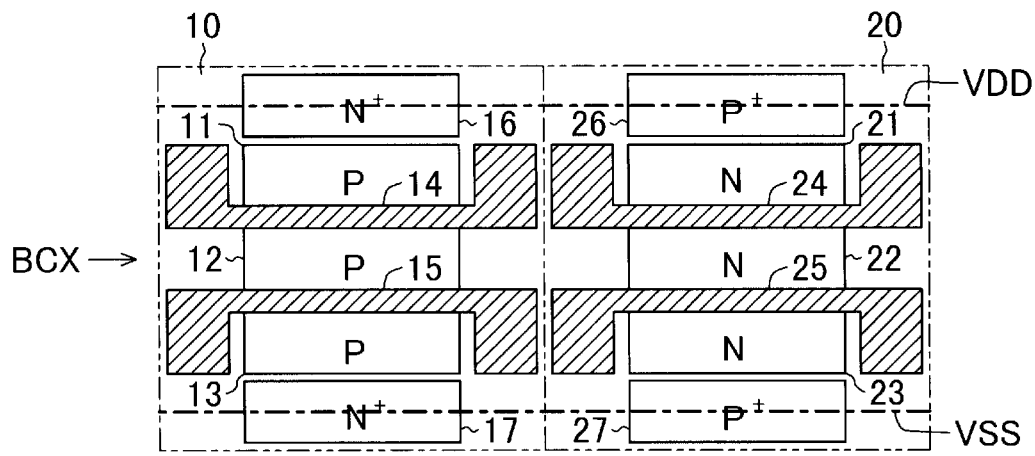
FIG. 14(A) is a top view of a prior art base cell.
Figure 14B:
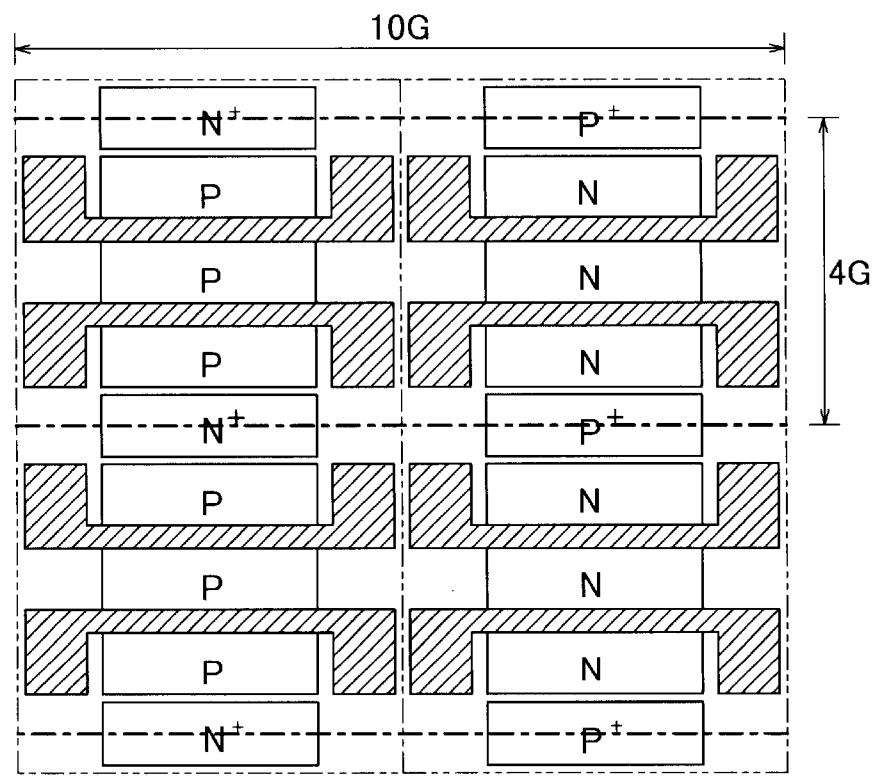
FIG. 14(B) is a top view of an array of 2×1 base cells, each cell is same as that of FIG. 14(A), arranged with superimposing well contact regions adjacent to each other in a design.

FIG. 13 is a top view of an array configured such that first sets, each having the base cell BC5 of FIG. 12 and a cell obtained by vertically flipping the base cell of FIG. 12 are arrayed in a column direction and second sets obtained by horizontally flipping the first sets are arranged horizontally adjacent to the first sets.

This array has a pattern 26H which is four times larger than the P$^+$-type well contact region 26G of FIG. 12. Further, since a pattern of the ground line VSS has a twice larger width than that of FIG. 11, an allowable current of the ground line VSS increases, enabling more of stabilization of the power supply potential VSS. This is also applied to the power supply line VDD when a semiconductor integrated circuit has a larger array than that of FIG. 13.

Although preferred embodiments of the present invention has been described, it is to be understood that the invention is not limited thereto and that various changes and modifications may be made without departing from the spirit and scope of the invention.

For example, since an embedded array has a gate array, the embedded array having above feature is included in the present invention. Further, a semiconductor integrated circuit having above feature fabricated according to the standard cell method is also included in the present invention.

What is claimed is:

1. A semiconductor integrated circuit comprising base cells arrayed in first and second directions perpendicular to each other, each base cell comprising:

an N-type well;

a plurality of P-type regions formed in said N-type well and arrayed in said second direction;

a P-type well arranged adjacent to said N-type well in said first direction;

a plurality of N-type regions formed in said P-type well and arrayed in said second direction;

gate lines each extending in said-first direction with passing above a channel between adjacent two of said P-type regions and passing above a channel between adjacent two of said N-type regions, each of said gate lines not having a gate contact region on either end thereof;

an N-type well contact region formed in said N-type well adjacent to a first directional end of one of said gate lines, said N-type well contact region being not along said gate lines;

a P-type well contact region formed in said P-type well adjacent to an opposite first directional end of one of said gate lines, said P-type well contact region being not along said gate lines;

an intra-cell interconnection formed in a first wiring layer;

a first power supply line connected to said N-type well contact region with passing in said second direction, said first power supply line formed in a second wiring layer; and a second power supply line connected to said P-type well contact region with passing in said second direction, said second power supply line formed in said second wiring layer.

2. The semiconductor integrated circuit of claim 1, wherein each of said gate lines has a gate contact region at a place between adjacent one of said P-type region and one of said N-type region.

3. The semiconductor integrated circuit of claim 2, wherein said P-type well contact region and said N-type well contact region both are band-shaped in said second direction.

4. The semiconductor integrated circuit of claim 2, wherein each two of said base cells adjacent in said second direction are symmetrical with respect to a straight line in said first direction, said P-type well contact regions of said two are serial in said second direction, and said N-type well contact regions are serial in said second direction.

5. The semiconductor integrated circuit of claim 4, wherein each two of said base cells adjacent in said first direction are symmetrical with respect to a straight line in said second direction, said P-type or N-type well contact regions of said two are merged into one.

6. The semiconductor integrated circuit of claim 1, wherein said second wiring layer is above said first wiring layer.

7. A semiconductor integrated circuit comprising base cells arrayed in first and second directions perpendicular to each other, each base cell comprising:

an N-type well;

a plurality of P-type regions formed in said N-type well and arrayed in said second direction;

a P-type well arranged adjacent to said N-type well in said first direction;

a plurality of N-type regions formed in said P-type well and arrayed in said second direction;

gate lines each extending in said first direction with passing above a channel between adjacent two of said P-type regions and passing above a channel between adjacent two of said N-type regions, each of said gate lines not having a gate contact region on either end thereof;

an N-type well contact region formed in said N-type well adjacent to a first directional end of one of said gate lines, said N-type well contact region not extending in said first direction;

a P-type well contact region formed in said P-type well adjacent to an opposite first directional end of one of said gate lines, said P-type well contact region not extending in said first direction;

an intra-cell interconnection formed in a first wiring layer;

a first power supply line connected to said N-type well contact region with passing in said second direction, said first power supply line formed in a second wiring layer; and a second power supply line connected to said P-type well contact region with passing in said second direction, said second power supply line formed in said second wiring layer.

* * * * *